United States Patent [19]

Psaras et al.

[11] Patent Number: 4,803,539
[45] Date of Patent: Feb. 7, 1989

[54] DOPANT CONTROL OF METAL SILICIDE FORMATION

[75] Inventors: Peter A. Psaras, Ossining; King-Ning Tu, Chappaqua; Richard D Thompson, Lake Peekskill, all of N.Y.

[73] Assignee: International Business Machines Corporation, Armonk, N.Y.

[21] Appl. No.: 717,984

[22] Filed: Mar. 29, 1985

[51] Int. Cl.[4] .............................................. H01L 23/48
[52] U.S. Cl. ...................................... 357/67; 357/59; 357/15
[58] Field of Search ................... 357/67 S, 71 S, 59 I, 357/678, 718, 15; 148/DIG. 147, DIG. 19; 437/196

[56] References Cited

U.S. PATENT DOCUMENTS

| | | | |
|---|---|---|---|
| 3,927,225 | 12/1975 | Cordes et al. | 427/84 |
| 3,995,301 | 11/1976 | Magdo | 357/67 S |
| 4,180,596 | 12/1979 | Crowder et al. | 427/42 |
| 4,259,680 | 3/1981 | Lepselter | 357/67 S |
| 4,313,971 | 2/1982 | Wheatley | 357/15 |
| 4,329,706 | 5/1982 | Crowder et al. | 357/71 |
| 4,333,099 | 6/1982 | Tanguay | 357/67 S |
| 4,336,550 | 6/1982 | Medwin | 357/59 |
| 4,389,257 | 6/1983 | Geipel et al. | 148/1.5 |

OTHER PUBLICATIONS

Proceedings of International Electron Devices Meeting (IEDM), Wash. DC, Dec. 7-9 1981, pp. 58-61, by Wang et al.
IBM Technical Disclosure Bulletin, vol. 20, #6, p. 2455, Nov. 1977, by Crowder et al.
IBM Technical Disclosure Bulletin, vol. 25, #12, p. 6624, May 1983, by Campbell et al.
Physical Review B, vol. 27, #2, p. 1173, Jan. 15, 1983, by Wittmer et al.

Primary Examiner—Andrew J. James
Assistant Examiner—Mark Prenty
Attorney, Agent, or Firm—Jackson E. Stanland

[57] ABSTRACT

A structure and method are described for forming different metal silicide phases, using the same metallurgy and the same processing steps. A layer of metal is deposited on a silicon substrate and is heated to thermally convert the metal-silicon combination to a metal silicide. The metal silicide phase which forms is strongly dependent upon the dopant and doping level in the silicon substrate, for various combinations of metal and dopant. Thus, different metal silicides can be formed on different regions of the substrate in accordance with the dopant and doping levels in those different regions, even though the process steps and metallurgy are the same. These different metal silicides can be tailored for different applications, including ohmic contacts, diode barrier contacts, interconnection lines, gate contacts, and diffusion barriers.

23 Claims, 2 Drawing Sheets

DOPANT CONTROL OF METAL SILICIDE FORMATION

DESCRIPTION

TECHNICAL FIELD

This invention relates to silicon devices and circuits, and more particularly to improved devices and circuits, and methods for making these using metal silicides wherein the metal silicide phase which is formed is dependent upon the dopant and the doping level in the silicon. In this technique, different metal silicide phases can be formed in a single heating step in different portions of a device, chip, or wafer in order to tailor the characteristics of the device, chip, or wafer.

BACKGROUND ART

In semiconductor and packing technologies, silicon is used in either single crystal or polycrystalline form. Further, metal silicids are used for many purposés, such as gate electrodes, ohmic contacts, interconnection lines, and Schottky barrier diode contacts. As examples of these various uses, reference is made to the following patents and publications which form a background for the present invention:

U.S. Pat. Nos. 4,180,596, 4,329,706 4,389,257; 3,927,225.

K. L. Wang et al, "Composite $TiSi_2$/n+ poly-Si Low Resistivity Gate Electrode and Interconnect for VLSI Device Technology", International Electron Devices Meeting (IEDN), Washingtion, D.C., Dec. 7-9, 1981 (Proceedings Thereof, pages 58-61).

B. L. Crowder et al, IBM Technical Disclosure Bulletin, 20, No. 6, page 2455, November 1977.

D. R. Campbell et al, IBM Technical Disclosure Bulletin, 25, No. 12, page 6624, May 1983.

As is apparent from these references, many different metals have been used to make the metal silicides. These metals include W, Ta, Mo, Ti, Nb, Rh, Pt, Pd, Co, rare earth metals, etc. Also, different phases of the metal silicides have been used in the past as noted by the following two publications:

M. Wittmer, J. Appl. Phys, 54, (9), page 5081, September 1983.

M. Wittmer and K. N. Tu, Physical Review B, 27, No. 2, page 1173, Jan. 15, 1983.

These two publications describe the growth kinetics for platinum silicide and palladium silicide and describe the influence of substrate orientation and silicide dopant. These and other references point out that the resistivity of the silicide, for any metal, often depends on the particular silicide phase which is formed. For example, PtSi may have a different resistivity than $Pt_2Si$.

In the prior art, metal silicides have been formed by a variety of techniques including codeposition (such as cosputtering and coevaporation), chemical vapor deposition (CVD), and thermal annealing of a metal layer deposited on a silicon substrate. When metal silicides are deposited by coevaporation or cosputtering they are in an amorphous form, and are then annealed at high temperatures (typically 700° C.-1200° C.) in order to make the silicide crystalline and to lower its resistivity.

References which describe codeposition of metal silicides include the aforementioned U.S. Pat. Nos. 4,389,257 and 4,329,706, as well as the K. L. Wang et al publication. Aforementioned U.S. Pat. No. 3,927,225 described thermal processes for producing metal silicides, where the metal (Pt) is either deposited on a silicon substrate and then heated, or deposited on a heated substrate. The growth of metal silicides formed by these thermal processes is described in detail in terms of its growth kinetics and diffusion by the aforementioned Wittmer and Wittmer et al publications.

In the prior art, it is possible to determine which metal silicide phase will be formed, and to control the silicide formation process such that a particular silicide phase will be formed. For example, in the thermal process wherein a metal layer is deposited on silicon and then annealed to grow a metal silicide, using particular temperature ranges will produce specified metal silicide phases. An illustration of this is the growth of $TiSi_2$ on silicon by depositing a layer of Ti thereon and annealing in the temperature range of approximately 500°-700° C. Another example is the formation of PtSi by annealing a Pt layer on silicon at a temperature range 400°-550° C. If a lower temperature range (200°-350° C.) is used, the phase $Pt_2Si$ will be formed.

For deposition techniques involving coevaporation or cosputtering, the relative amounts of metal and silicon in the sources (or targets) are adjusted to provide the desired stiochiometric proportions of silicon and metal in the metal silicide compound. It is not possible to use the same process to form different metal silicide phases simultaneously in different parts of a device, chip, or wafer. If different silicide phases are desired, different annealing steps must be undertaken, or additional co-deposition steps are required. Another alternative in the prior art is to use different metals to form different silicides in different locations. Of course, this also requires more complicated processing.

In this technology, it is often the situation that different resistivities are required for metal silicides in different portions of the chip or wafer. For example, a metal silicide Schottky barrier contact will require a different resistivity than a metal silicide used either as an interconnect line or as an ohmic contact.

In the prior art, there is no way to easily tailor the resistivity of the metal silicide in accordance with its use, if the same metal is used to form multiple metal silicide layers. Thus, if it is desired to fabricate VLSI structures or to fabricate different devices on the same chip, different metallurgical combinations and/or processing steps have heretofore been required.

Accordingly, it is a primary object of this invention to provide a silicon substrate-metal silicide combination in which the phase of the metal silicide is dependent upon the dopant and doping level of the substrate.

It is another object of this invention to provide a process for forming different phases of metal silicide in different portions of a semiconductor device, chip, or wafer, using the same metal throughout and the same processing steps.

It is another object of this invention to provide a new, additional control for metal silicide formation in order to determine the phase of the metal silicide compound which is formed.

It is another object of the present invention to provide different compound phases of a metal silicide, where the phase which is formed is dependent upon a property of the silicon substrate.

It is a further object of this invention to provide an improved annealing (thermal) technique for forming metal silicides, where an additional degree of control is provided in order to determine the phase of the metal silicide compound which is formed.

It is a still further object of this invention to provide an improved annealing technique for forming metal silicides on a silicon substrate, wherein the resistivity of the metal silicides so formed can be controlled.

It is another object of this invention to provide a technique for the growth of metal silicides on a substrate, which can be used to provide different compound phases of a metal silicide, in accordance with the application for which the metal silicide is used.

It is a further object of this invention to provide an improved technique for the growth of a metal silicide by thermal processes, wherein the phase of the metal silicide compound which is formed is controlled by a property of the silicon substrate.

It is another object of the present invention to use a single constituent metal layer for the growth of metal silicide on a silicon substrate, wherein different metal silicide phases can be formed on different regions of the substrate in a single process.

It is another object of the present invention to provide metal silicide-silicon substrate combinations wherein the phase of the metal silicide formed on the silicon substrate by thermal processing of a metal on the substrate is determined by the dopant and by the level of doping concentration at the metal-silicon interface during silicide formation.

DISCLOSURE OF THE INVENTION

Applicants have discovered that, for a silicon substrate, the metal silicide phase which is formed by thermal processing of a metal deposited thereon is dependent upon the level of doping at the metal-silicon interface for many combinations of metals and substrate dopants. This can be used to provide improved structures in which the metal silicide can be tailored to have different properties in different areas of the substrate in order to enhance the particular applicaton for which the metal silicide is used. This also provides an improved process, since the same series of steps can be used to provide different phases of a given metal silicide in different regions of the silicon substrate without changing metallurgies or processing steps.

As an example, a single layer of rhodium on a silicon substrate can be used to thermally form a rhodium silicide compound with the silicon substrate. The silicide compound phase which is formed will depend upon the dopant and the doping level of the underlying substrate. Consequently, different rhodium silicide phases can be formed in different regions of the substrate, in order to provide silicides having different conductivity.

Applicants have further discovered that this new effect applies only to certain metal-dopant combinations. The metals which can be used to form different silicide phases in accordance with this invention are those which will form different compound phases with silicon and which have a strong effect with the dopant in the silicon. If the metal is one which will react strongly with the dopant to form a compound having a higher melting point relative to the melting point of the metal silicide phase normally to be formed on undoped (i.e., lightly doped or intrinsic) silicon, the dopant will have a strong effect on the phase of the metal silicide that is formed and will alter the phase from that normally to be expected. A more quantitative guideline will be described later for choosing the metal-dopant combinations which will work to determine the phase of the metal silicide.

As examples, metals which can be used to form different phase silicides in accordance with the present invention include Ti, Mo, W, Ta, Cr, Hf, Rh, Co, Ni, Fe and Mn. Dopants which can be used include B, As, P, Sb.

These and other objects, features, and advantages will be apparent from the following more particular description of the preferred embodiments.

BRIEF DESCRIPTION OF THE DRAWINGS

In FIG. 2, an annealing step produces the metal silicides, indicated by the cross-hatched areas.

In FIG. 3, the same metal M is deposited in different regions of the chip, while in FIG. 4 an annealing step has produced the metal silicide regions indicated by cross-hatching, where different phases of silicide are formed in accordance with the dopant and the doping level of the silicon substrate regions on which the metal M is deposited.

BEST MODE FOR CARRYING OUT THE INVENTION

Figure 1:
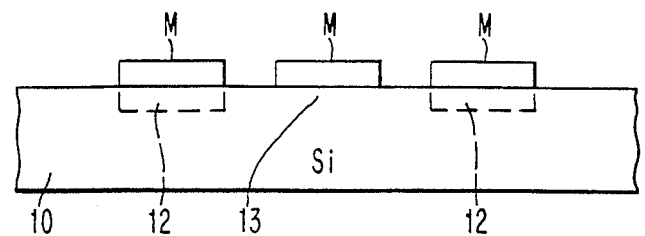
FIGS. 1 and 2 illustrate the invention in which different metal silicide phases are formed on a silicon substrate in accordance with the doping concentration in the regions of the substrate below the metal layers M (FIG. 1).

As noted previously, VLSI circuit design is highly complex and requires a variety of electrical properties which heretofore have been satisfied only by utilizing numerous dissimilar metallization layers. The utilization of several different types of metals and metal silicides within one intergrated circuit in order to satisfy these electrical requirements often causes material and processing problems. The wide range of metal silicides which are used to obtain different electrical properties leads to material problems which evolve during processing of these dissimilar metal silicides. Further, failure may also occur during device operation as the different metallizations and metal silicides interact via atomic diffusion. This type of interaction becomes increasingly critical as device dimensions continue to decrease.

It is particularly in this context of high density circuits and fabrication techniques that the present invention has its greatest utility. Applicants have discovered that the same metal can be used throughout a circuit in order to provide the required metal silicides. In contrast with the prior art, however, the exact phase of the metal silicide compound which is formed can be tailored to the purpose for which the metal silicide is to be used. Thus, rather than requiring different metals in different portions of the circuit in order to provide different metal silicides, silicides of the same metal can be tailored for a particular application. This is accomplished by using different compound phases of the metal silicide in different portions of the circuit. For example, if the metal is rhodium (Rh), rhodium silicide phases such as RhSi and $Rh_2Si$ can be formed during the same thermal conversion step. The particular rhodium silicide phase which is formed will depend upon the dopant and the doping concentration level in the silicon substrate.

The method for producing different metal silicide phases in this invention is broadly termed "thermal conversion". In a first example of this method, a metal is deposited on a silicon substrate, followed by a heating step in order to thermally produce a metal silicide. The phase of the metal silicide that is produced will depend upon the doping level of the silicon, for selected combinations of metal and dopant, as will be explained later. In a second example of this method, a metal can be deposited onto a heated silicon substrate in order to produce the conversion of metal and silicon to metal silicide. Both techniques are included in the term "thermal conversion".

Prior to describing embodiments of the invention as illustrated by the drawing, applicants will discuss various combinations of metal, dopant, and silicon which can be used in the practice of the present invention. Guidelines will be presented for choosing the desired metal silicide phase in accordance with the dopant and the doping level.

SELECTION CRITERIA

The effect wherein different metal silicide phases can be determined in accordance with the choice of dopant and dopant concentration level in a silicon substrate does not apply to all combinations of metals and dopants. Data has been established for many metal-dopant combinations which work in accordance with the present invention, and a guideline has been developed to teach those of skill in the art how to choose combinations which will exhibit the desired effect. As a starting point in this discussion, the TABLE below lists several metallic species which can be used to form metal silicides. Four dopants, B, Sb, P, and As, are listed. Also, the doping level, in atoms/cm$^3$, which can be equalled or exceeded in order to produce the effect, is listed for each of these dopants.

The column labelled "metallic species" lists several metals which will form metal silicides with silicon (either single crystal or polycrystalline). The column labelled "temperature range" gives the temperature range in which the listed metal silicide phases which can be formed by thermal conversion. The column labelled "silicide (M.P. °C.)" gives the silicide and their melting points (M.P.) where the silicides are formed in the listed temperature ranges. These are the phases which would be formed on undoped (i.e., lightly doped on intrinsic) silicon.

The columns headed "Compound (Melting Point °C.)" list compounds which are most likely to form between the metallic species and the listed dopants, and give the melting points of each of these metal-dopant compounds. As will be apparent, the melting points of the most likely to form metal-dopant compounds, in relation to the melting points of the metal silicide compounds, provide a strong indication of the effect of the dopant on the metal silicide phase which is formed, and are used in the guideline for selection of particular combinations which work in accordance with the present invention.

TABLE

| METALLIC SPECIES | TEMPERATURE RANGE (°C.) | SILICIDE (M.P. °C.) | B $10^{17}$ | Sb $10^{18}$ | P $10^{18}$ | As $10^{17}$ |
|---|---|---|---|---|---|---|
| | | | COMPOUND (MELTING POINT °C.) | | | |
| Ti | 500–700 | $TiSi_2$ (1500) | $TiB_2$* (3325) | $Ti_4Sb$ (900) | $Ti_3P_2$* (2100) | $Ti_4As$ (1355) |
| Mo | 600–800 | $MoSi_2$ (2050) | MoB* (2600) | $Mo_3Sb_7$ (780) | — | $Mo_5As_4$ (1830) |
| W | 700–900 | $WSi_2$ (2160) | $W_2B$* (2670) | WSb (630) | — | — |
| Ta | 600–800 | $TaSi_2$ (2200) | TaB* (3090) | — | — | — |
| Cr | 350–550 | $CrSi_2$ (1490) | $CrB_2$* (2200) | CrSb (1110) | $Cr_3P$ (1550) | — |
| Hf | 500–750 | HfSi (2142) | $HfB_2$* (3380) | — | — | — |
| | 700–800 | $HfSi_2$ (1600) | — | — | — | — |
| Zr | 500–700 | $ZrSi_2$ (1850) | $ZrB_2$* (3245) | $Zr_2Sb$ (875) | — | — |
| Pd | 200–500 | $Pd_2Si$ (1394) | $Pd_{16}B_3$ (1250) | $Pd_3Sb$ (1200) | $PdP_2$ (1150) | $Pd_5As_2$ (850) |
| Pt | 200–350 | $Pt_2Si$ (1100) | $Pt_3B_2$ (940) | $PtSb_2$* (1225) | $Pt_{20}P_7$ (683) | $PtAs_2$ (597) |
| | 400–550 | PtSi (1229) | — | — | $PtP_2$ (1600) | — |
| Rh | 375–500 | RhSi | $RhB_{11}$* (1260) | $Rh_2Sb$* (1450) | —* | — |
| Co | 350–550 | CoSi (1460) | CoB* (1460) | $CoSb_2$ (1113) | $Co_2P$ (1386) | CoAs (1180) |
| | 550–800 | $CoSi_2$ (1326) | — | — | — | — |
| Ni | 200–400 | $Ni_2Si$ (993) | NiB* (1600) | $Ni_5Sb_2$* (1170) | $Ni_5P_2$* (1175) | $NiAs_2$* (1040) |
| | 300–750 | NiSi (992) | — | — | — | — |
| | 800–900 | $NiSi_2$ (1318) | — | — | — | — |
| Fe | 350–550 | $FeSi_2$ | $FeB_2$* | — | $Fe_2P$* | FeAs* |

TABLE-continued

| METALLIC SPECIES | DOPANT LEVEL (at/cm$^3$) GREATER THAN TEMPERATURE RANGE (°C.) | SILICIDE (M.P. °C.) | B $10^{17}$ | Sb $10^{18}$ | P $10^{18}$ | As $10^{17}$ |
|---|---|---|---|---|---|---|
| | | | COMPOUND (MELTING POINT °C.) | | | |
| Mn | 400–600 | (960) MnSi$_2$ (1152) | (2100) MnB$_4$* (2160) | Mn$_2$Sb (948) | (1365) Mn$_2$P* (1327) | (1030) Mn$_2$As (1029) |

*DOPANT HAS STRONG EFFECT ON SILICIDE FORMATION

The formation of metal silicides by thermal conversion of a metal layer on a silicon substrate is well known in the art. Further, it is known to deposit a metal onto a heated substrate so that during deposition the metal silicide will form. In both of these conversion processes, it is known what metal silicide phase will form in accordance with the temperature range that is used. For example, the nickel silicide phase Ni$_2$Si will form by thermal conversion in the approximate temperature range 200°–400° C. For temperatures in the range 350°–750° C., the nickel silicide phase NiSi will form, while for thermal conversion temperatures in the range 800°–900° C. the nickel silicide phase NiSi$_2$ will form.

To determine what metal-dopant combination will work in accordance with the present invention, the melting point of the metal-dopant compound most likely to form (at the temperature of silicide formation) is compared with the melting point of the metal silicide phase which would be formed on undoped (i.e., lightly doped or intrinsic silicon (at that temperature). The melting point of the metal-dopant compound must be greater than the melting point of the metal silicide phase in order for the dopant to have a strong effect on the silicide phase which is formed. As a general guideline, the melting point of the metal-dopant compound must be at least about 10% greater, in degrees Kelvin, than the melting point of the metal silicide phase. If this is so, the presence of the doping will have a strong effect on the metal silicide phase that is formed, if the doping level is sufficiently high, for example, equal to or greater than the levels listed on the top of the TABLE, for these four dopants.

As an example, consider the formation of a nickel silicide. The substrate in this example is doped with boron to a level at least 10$^{18}$ atoms/cm$^3$. The compound formed between nickel and boron, NiB, has a melting point of 1600° C., as is apparent from a binary phase diagram of the Ni-B system. If the nickel silicide is one of those listed in column 2, the melting point of NiB is greater than the melting point of any of those three nickel silicide phases. This difference in melting point is greater than about 10%, in degrees K., of the melting point of the nickel silicide phase. Therefore, sufficiently high levels of boron doping will have an appreciable effect on the nickel silicide phase that is formed. For a conversion temperature of 300°–500° C., the phase NiSi is normally formed. However, the presence of sufficiently high levels of boron doping will cause the formation of the nickel silicide phase Ni$_2$Si. If there is another region of the silicon substrate having a low level of boron doping, the nickel silicide phase NiSi will be formed in that low doping region.

In the TABLE, the blank portions are those for which a binary phase diagram is not available in the literature. For example, a binary phase diagram for the W-P system is not available, as indicated by the dash (-) in that portion of the column. However, this does not necessarily mean that the metal-dopant combination (W-P) would not exhibit the effect of this invention. As another example, consider the Rh-P combination. Although a binary phase diagram is not available for Rh-P, data has been obtained indicating that the inventive effect is seen for the Rh-P combination.

As another example, consider the formation of titanium silicides. Assume that the substrate is either a single crystal silicon wafer or a polycrystalline silicon wafer, doped with phosphorus. The level of phosphorus doping is at lest about 10$^{18}$ atoms/cm$^3$. For thermal conversion, a temperature range of 500°–700° C. will produce the silicide phase TiSi$_2$ on undoped silicon (i.e., silicon having light doping level). However, in the presence of P doping at a level greater than 10$^{18}$ atoms/cm$^3$, the phosphorous dopant has been demonstrated to have a strong effect on the silicide phase which is formed. In the presence of the high phosphorus doping, the phase TiSi will be formed, as verified by laboratory tests.

In a practical sense, the provision of different metal silicide phases is important in terms of the electrical conductivity of these different phases. As an example, the conductivity of the phase TiSi$_2$ is approximately twice that of the phase TiSi.

Referring again to the TABLE, the asterisks (*) are used to indicate where the dopant has a strong effect on silicide formation. Thus, for boron-doped silicon, where the doping level is at least about 10$^{18}$ atoms/cm$^2$, the metallic species whose silicide formation is strongly affected include Ti, Mo, W, Ta, Cr, Hf, Zr, Rh, Co, Ni, Fe, and Mn. For Sb doping, the metal species whose metal silicides are most strongly affected include Pt, Rh, and Ni. Of course, if Ni is used and the thermal conversion temperature is chosen to be in the range 800°–900° C., Sb doping will not affect the silicide phase which is formed. This is because, in this instance, Ni$_5$Sb$_2$ has a lower melting point than the phase NiSi$_2$, which would normally be formed on undoped (i.e., lightly doped or intrinsic) silicon in this temperature range.

For P doping to a level greater than about 10$^{17}$ atoms/cm$^3$ the metal silicides strongly affected include those of Ti, Rh, Ni (at temperatures less than 800° C.), Fe, and Mn.

When the silicon substrate is doped with arsenic (As), the metallic species whose silicide formation is strongly determined by the As dopant level include Ni (at temperatures less than 800° C.) and Fe. For Ni, the melting point of the Ni-As compound, NiAs$_2$, is not greatly in excess of the melting point of the two nickel silicide phase Ni$_2$Si and NiSi, but actual data has revealed the effect of As doping on the phase of the Nisilicide which is formed, at temperatures less than 800° C.

In the case of iron-silicides formed on As-doped silicon, actual data has revealed that As doping will affect the iron-silicide phase that is formed. For this metal, the difference in melting points between FeAs and FeSi$_2$ is somewhat less than 10%, but the dopant effect has been observed in the laboratory. This is why the 10% rule is a guideline. If the difference in temperature in degrees K. is 10% or greater, the effect of the dopant is clearly seen. For differences in temperatures approaching 10%, the effect may be seen, as exemplified by the nickel silicide and iron silicide data.

Generally, as the temperature of silicide formation increases, the silicide becomes more silicon-rich. The presence of the dopant appears to affect the temperature ranges at which the various silicide phases can form, and in particular the dopant seems to slow the kinetics of silicide formation. This allows other phases to nucleate and grow. Another way to view this is that the presence of the dopant shifts the temperature ranges for reaction so that the ranges for different silicide phases overlap, allowing different phases to form in a temperature range where normally only one phase would form.

As an example, the phase NiSi will form on undoped silicon at a temperature of about 600° C. However, the presence of boron doping in a sufficient amount will alter the kinetics of silicide formation in a way to retard the NiSi formation. This will allow a more metal-rich silicide, $Ni_2Si$, to form instead of NiSi. Thus, the temperature ranges of formation of NiSi and $Ni_2Si$ are "overlapped" by the presence of this dopant.

In the preceeding example, if the temperature of silicide formation were chosen to be lower, for example, 200° C., the silicide phase to be expected on undoped silicon would be $Ni_2Si$. The presence of sufficiently large amounts of boron doping could then lead to the formation of Ni silicide phases other than those listed in the TABLE (for example, more Ni-rich phases). It is also possible that there could be no Ni-silicon reaction, so that the heating step would only leave Ni metal on silicon.

It is possible that the dopant effect, as described herein, could be overcome by the use of very high temperatures (or very long heating times) which would speed up the kinetics of silicide formation. This increase in the rate of silicide formation would offset any slow-down of reaction kinetics due to the dopant. In the practice of this invention, the temperature range (and heating time) are chosen to be such that the dopant effect is realized, i.e., the dopant will influence the silicide phase that is formed.

The amount of dopant listed in the TABLE is an amount which has been determined will give the aforementioned dopant effect, i.e., it is an amount which will determine the phase that actually forms. However, the amount of dopant that will begin to affect what phase will form is not precisely known, and will vary for different metal-dopant combinations. For example, boron doping has a pronounced effect on silicide formation for most metals and its presence in amounts less than $10^{18}$ atoms/cm$^3$ will most likely have an effect. Based on laboratory results, it appears that the dopant ranges can be at least about an order of magnitude less than those listed in the TABLE, while still having an effect on phase formation. Thus, the present invention includes embodiments in which the silicide which is formed is comprised of more than one phase, including the phase which would normally form on undoped (i.e, lightly doped or intrinsic) silicon and at least one other phase produced by the dopant effect of this invention.

As another example of a lower doping range being effective the "snowplow effect", wherein dopants in a material (such as a metal) are pushed, or "snowplowed", ahead of the metal-silicon boundary when a silicide is being formed, can cuase a large amount of dopant to be present in a localized region of the silicon substrate. This localized doping can be sufficient to cause an effect on the phase of the silicide that is formed. Thus, in the further practice of this invention, the origin of the dopant and the initial doping level are not critical. It is only important that the dopant-metal combination be one in which the dopant has an effect on phase formation, and that the doping level at the time of silicide formation is such that the reaction kinetics for silicide formation are affected (thereby influencing which phase is formed).

In the context of this invention, the substrate is "doped" when it contains enough of a selected dopant that the dopant has an effect on the metal silicide phase which is formed. The term "undoped" means that the substrate is either not doped, or the doping level is sufficiently small that the dopant does not have an effect on the metal silicide phase that is formed. Of course, "undoped" also includes the situation where the chosen dopant does not affect metal silicide formation, even though it is present in a large amount. For example, Sb doping does not have an affect on the metal silicide phase which is formed when the metallic species is Ti (see TABLE). Thus, even though Sb may be present in a large amount, for example, $10^{20}$ atoms/cm$^3$, it will not affect the phase of the titanium silicide which is formed.

The following examples will illustrate the dopant effect and will be described before addressing applications of this invention, as illustrated by the embodiments in FIGS. 1–7.

EXAMPLE 1

A layer of Rh was deposited on both undoped silicon and phosphorus (P)-doped silicon. The structures were then heat-treated for approximately 120 minutes, at 400° C. The Rh silicide formed on the undoped silicon (that is, silicon which had a low doping level—much less than about $10^{18}$ atoms/cm$^3$) had a resistivity of 164 microohm-cm., while the Rh-silicide formed on the P-doped silicon had a resistivity of 81 microohm-cm. The silicide phase formed on the undoped silicon was RhSi, while the silicide phase formed on the doped silicon was $Rh_2Si$.

EXAMPLE 2

Ti silicides were formed both on undoped silicon and on P-doped silicon. To do so, a layer of Ti was deposited on the doped and undoped silicon, and then thermal conversion was used to form the Ti silicide. In this process the Ti-silicon structure was heated to approximately 600° C., for 120 minutes. The Ti silicide phase formed in the undoped silicon was $TiSi_2$, having a resistivity of 26 microohm-cm. The Ti silicide phase formed on the doped silicon was TiSi, having a resistivity of 45 microohm-cm.

EXAMPLE 3

Ni silicides were formed on both undoped silicon and P-doped silicon. After deposition of a layer of nickel on the doped and undoped silicon, Ni silicides were formed by heating to 300° C. for 120 minutes. The Ni silicide formed on the undoped silicon was NiSi, having a resistivity of 11 microohm-cm. The Ni silicide formed on the P-doped silicon was $Ni_2Si$, having a resistivity of 18 microohm-cm.

EXAMPLE 4

Pt silicides were formed on both undoped and P-doped silicon. A layer of platinum was deposited on the doped and undoped silicon and was thermally converted to Pt silicide by heating to 300° C., for 120 minutes. In this example, the phase of metal silicide formed on the undoped silicon was a combination of PtSi and $Pt_2Si$, having a resistivity of 22 microohm-cm. The Pt silicide formed on the P-doped silicon was $Pt_2Si$, having a resistivity of 20 microohm-cm. This data is consistent with the results of the TABLE, where P-doping does not have a significant influence on the Pt silicide phase that is formed.

EXAMPLE 5

Co silicide was formed on both undoped and P-doped silicon. A layer of Co was deposited on the doped and undoped silicon, and then thermally converted to Co silicide by heating at 400° C. for 120 minutes. The silicide phase formed on the undoped silicon was $Co_2Si$, which was the same phase formed on the P-doped silicon. This result is the same as the derived from the TABLE, where P doping did not affect the Co silicide phase that was formed.

REPRESENTATIVE EMBODIMENTS (FIGS. 1-7)

Figure 2:
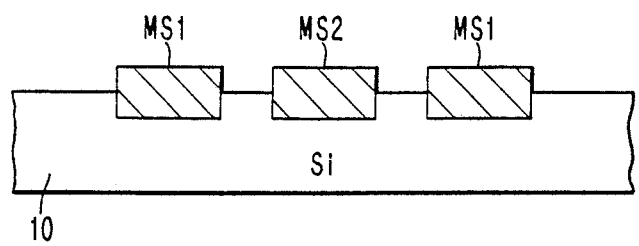

FIGS. 1 and 2 illustrate a technique and structure in which different metal silicide phases are formed on a single silicon substrate, having doped and undoped regions therein.

In FIG. 1, a substrate 10 of undoped silicon includes doped regions 12 therein. A layer of metal M is deposited on substrate 10 such that the metal M is formed both on the doped regions 12 and also on an undoped region 13 of the substrate. The metal M and the dopant in regions 12 are chosen so that the dopant will have a strong effect on the phase of metal silicide formation.

FIG. 2 represents the structure which is formed after an annealing step in order to thermally convert the metal and silicon to a metal silicide. Because the dopant has a strong effect on metal silicide formation, the metal silicide formed in the undoped region 13 has a different phase than that formed in the doped regions 12 of the substrate. Thus, a first metal silicide phase MS1 is formed in the doped regions 12 while a second metal silicide phase MS2 is formed in the undoped region 13.

In the practice of this invention, different metal silicides can be formed in the same process, i.e, during the same thermal conversion step, dependent only upon the choice of metal, dopant, and doping level of the substrate. It is not necessary to change metallurgies or to break a vacuum in a deposition process.

Figure 3:
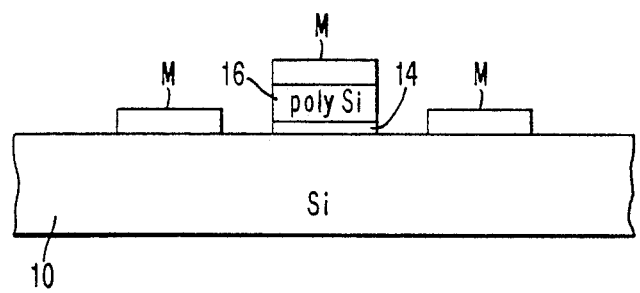
FIGS. 3 and 4 illustrate the invention wherein different metal silicide phases are formed in non-coplanar regions of a semiconductor chip.
Figure 4:
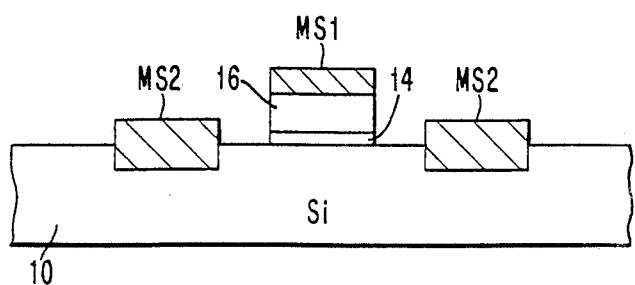

In FIGS. 3 and 4, the substrates on which the metal silicide phases are formed are different, but the principle of the invention is the same. The embodiment of these figures illustrates that the invention can be applied to both signal crystal and polycrystalline silicon, where the silicon substrate need not be the same substrate or even a coplanar substrate.

Referring now to FIGS. 3 and 4, the same reference numerals will be used whenever possible to illustrate structural features corresponding to those in FIGS. 1 and 2. Thus, single crystal silicon 10 has deposited thereon an oxide layer 14, such as $SiO_2$. Deposited on oxide layer 14 is a layer of polycrystalline silicon 16, which is doped in accordance with the meaning of the present invention. A layer M of the same metal is deposited on both silicon substrate 10 and polycrystalline silicon 16.

In FIG. 4, thermal conversion of metal and silicon to a metal silicide has been accomplished. This forms metal silicides on the silicon substrate 10 and on the polycrystalline silicon 16. However, the metal silicide phases which are formed are different, since the polycrystalline silicon 16 is doped while the silicon substrate 10 is undoped. The metal silicide phase formed on doped substrate 16 is denoted MS1, while the metal silicide phase formed on undoped substrate 10 is denoted MS2.

Figure 5:
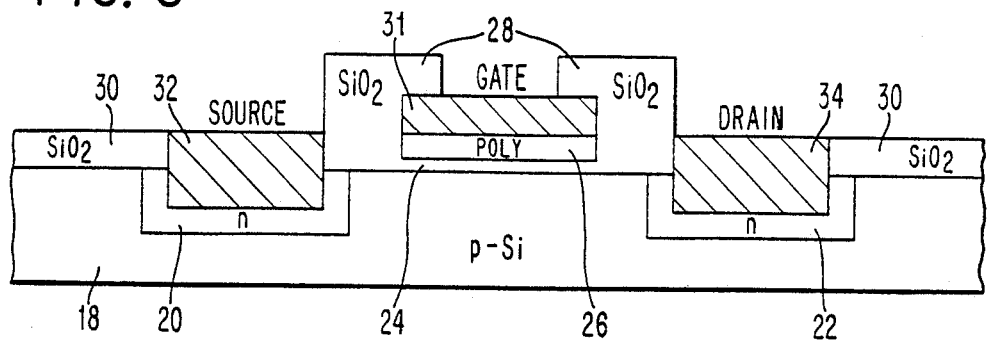
FIG. 5 shows a MOS-FET structure in which different silicide phases are utilized for the source and drain contacts, and for the gate electrode. These different silicide phases are formed by the thermal conversion of a single constituent layer of metal overlying both the source and drain regions and the gate region.

FIG. 5 illustrates a MOS-FET structure in which the metal silicide regions are shown cross-hatched. As an example of the types of metal silicide phases that can be used in the structure, the source and drain contacts can be RhSi while the gate contact can be $Rh_2Si$. In more detail, the structure of FIG. 5 includes a single crystal silicon wafer 18 which is doped p-type. The n-type regions 20 and 22 are formed in the silicon wafer 18 and are the source and drain regions, respectively. A thin oxide layer 24 is the gate oxide, over which is a phosphorus-doped polysilicon layer 26. Surrounding the gate region of the device is a layer 28 of insulating material, such as $SiO_2$. The $SiO_2$ oxide layer also extends as a layer 30 located outside the source and drain regions 20 and 22.

A metal layer (not shown) is deposited on the source and drain regions 20 and 22, respectively, and also on the polysilicon layer 26. This metal layer is thermally converted to the metal silicides shown as cross-hatched regions in FIG. 5.

The metal silicide phase used as the source and drain contacts can be different than the metal silicide phase used as the gate contact, even though the same metal is deposited in the source, drain, and gate regions. Thus, in an example where the metal layer is Rh, the gate contact silicide 31 formed on the highly phosphorus doped polysilicon layer 26 will be strongly influenced by the dopant, and will be $Rh_2Si$. This contrasts with the rhodium silicide phase formed as contacts 32 and 34 in the source and drain regions, respectively. In these regions, the doping level is either low or another dopant, having no effect, is used. In the source and drain areas, the Rh silicide phase will be RhSi.

The basic structure of FIG. 5 is well known in the art, as is the process for producing it. The difference over the prior art is that the same metal can be used to form different silicide phases in different regions of the structure, using a single set of process steps for the simultaneous formation of all silicide phases.

Figure 6:
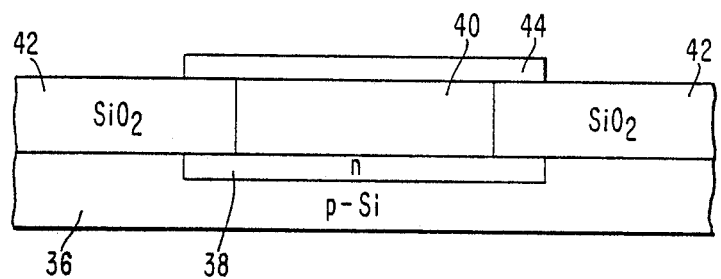
FIGS. 6 and 7 illustrate processing steps used to provide a shallow gate Schottky barrier contact and a diffusion barrier, where the Schottky barrier contact and the diffusion barrier are two different phases of a metal silicide. In this manner, the metal silicide is tailored for a particular application in accordance with the phase that is produced during the thermal conversion step.
Figure 7:
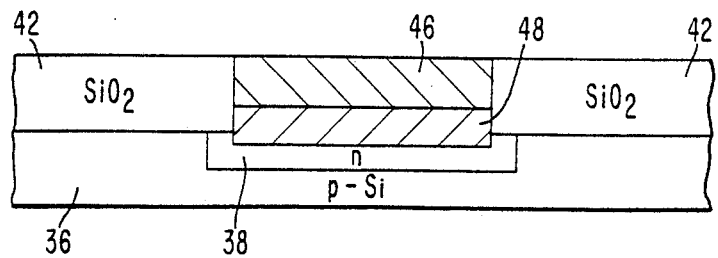

FIGS. 6 and 7 illustrate a process and structure in which a first metal silicide phase is used to form a Schottky barrier contact, while a second metal silicide phase is used as a diffusion barrier.

In more detail, the structure of FIG. 6 includes a p-type substrate 36 having an n-type region 38 in its top surface. A layer 40 of metal is deposited on n-type region 38, and is surrounded by an insulator layer 42, typically $SiO_2$. A highly doped polycrystalline silicon layer 44 is deposited on the metal layer 40 and overlaps portions of the insulator layer 42. In a representative embodiment, the metal layer 40 is rhodium (Rh), while the dopant in polycrystalline silicon layer 44 is phosphorus.

In the structure of FIG. 6, metal layer 40 is in contact with two substrates: the single crystal silicon region 38 and the highly doped polycrystalline silicon layer 44. This leads to the possibility of two metal silicide phases being formed.

The structure of FIG. 6 is then annealed to thermally convert metal layer 40 to a metal silicide. For example, if metal layer 40 is Rh, and the layer 44 is sufficiently doped with phosphorus, thermal conversion at 400° C., can be used to provide two different Rh silicide regions. The heating step generally takes from approximately ½ hour to a few hours, and typically about 2 hours. This will produce two Rh silicide regions 46, 48, as indicated by the oppositely directed cross-hatching in FIG. 7.

Referring more particularly to FIG. 7, a first metal silicide phase 46 forms between metal layer 40 and polysilicon layer 44, while a second metal silicide phase 48 forms between metal layer 40 and single cyrstal silicon layer 38. For a RH metal layer 40, silicide layer 48 will be RhSi if the doping of region 38 is sufficiently low (or if a non-influencing dopant is used). In the same example, the silicide phase 46 will be Rh$_2$Si. These two silicide phases differ in their electrical conductivity and their use in this particular example. RhSi layer 48 is used as a Schottky barrier contact providing a barrier of 0.75 eV, while Rh$_2$Si silicide layer 46 is used as a diffusion barrier for the shallow contact 48.

In the practice of this invention, a single set of processing steps can be used to simultaneously produce metal silicides having different properties even though only a single metallurgy is used. The embodiments illustrate several different applications of this invention wherein the same or different substrates are used. In this context, the substrate is the silicon layer in contact with the metal and which is used to form the metal silicide. This means that the substrate can be either above or below the metal layer, or can in any other way contact the metal layer.

The metals chosen to illustrate the present invention are those which are most commonly used in the semiconductor industry for applications including gate contacts, Schottky barrier contacts, ohmic contacts, interconnection lines, and diffusion barriers. Of course, those of skill in the art will recognize that this invention can be used for any application of metal silicides and is not restricted to the applications illustrated in the drawing.

It will also be recognized by those of skill in the art that the portions of the TABLE left blank have only been left blank because appropriate binary phase diagrams are not available for certain combinations of the listed metallic species and dopants. However, it may be that these metallic species - dopant combinations form high melting point compounds. If such is the case, a sufficient amount of the dopant will have an effect on the metal silicide phase that is formed.

In general, the metal species must form at least two metal silicide phases, at least one of which has a melting point that is approximately 10% (or more) less, in degrees Kelvin, than the melting point of the metaldopant compound which is most likely to form at the thermal conversion temperature.

In the practice of this invention, it will also be apparent to those of skill in the art that the effect described herein may be seen with other dopants, such as the p-type dopants Al, Ga and In. The guidelines with respect to the metals and dopants listed in the TABLE would also be applied in the case of these other p-type dopants.

Thus, while the invention has been described with respect to particular embodiments thereof, it will be apparent to those of skill in the art that variations can be made without departing from the spirit and scope of the present invention, using in particular the guidelines described hereinabove.

Having thus described our invention, what we claim as new and desire to secure by Letters Patent is:

1. A metal silicide-silicon structure including thermally formed metal silicides including the same metal and having first and second compound phases in first and second regions of said structure, comprising:
    a substrate having a first region thereof which is doped with a selected dopant to a level sufficient to cause said first region to affect the compound phase of a metal silicide thermally formed thereon,
    said substrate including a second region that is either undoped or doped with an impurity incapable of affecting the comound phase of a metal silicide formed thereon or doped with an impurity capable of affecting said phase in an amount sufficiently low that said phase is unaffected,
    a metal silicide thermally formed on said first and second regions and including the same metal in said first and second regions, the compound phase of said metal silicide in said first region being different than the compound phase of said metal silicide formed in said second region.

2. The structure of claim 1, wherein said silicon is single crystal.

3. The structure of claim 1, where said silicon is polycrystalline

4. The structure of claim 1, where said silicon is n-doped.

5. The structure of claim 1, where said silicon is p-doped.

6. The structure of claim 1, where said doping level is greater than approximately $10^{18}$ atoms/cm$^3$.

7. The structure of claim 1, where said metal constituent is selected from the group consisting of Ti, Mo, W, Ta, Rh, Ni, Pt and Cr.

8. The structure of claim 1, where said dopant is an element which can form a compound with said metal constituent at the temperature of said thermal conversion, said compound having a metal point which is greater than the melting point of the silicide phase which would form on said undoped silicon substrate at the temperature of said thermal conversion.

9. The structure of claim 1, where said metal constituent is selected from the group consisting of Ti, Mo, W. Ta, Cr, Hf, Zr, Rh, Co, Ni, Fe, Mn, and said dopant is B.

10. The structure of claim 1, wherein said metal constituent is selected from the group consisting of Pt, Rh, and Ni, and said dopant is Sb.

11. The structure of claim 1, where said metal constituent is selected from the group consisting of Ti, Ni, Rh, Fe, and Mn, and said dopant is P.

12. The structure of claim 1, where said metal constituent is selected from the group consisting of Ni and Fe, and said dopant is As.

13. A metal silicide-silicon structure, including:
    a first silicon region which is undoped or doped to a level less than about $10^{18}$ atoms/cm$^3$,
    a second silicon region containing a selected dopant in an amount at least about $10^{18}$ atoms/cm$^3$,
    metal silicides simultaneously thermally formed with said first and second silicon regions, said metal silicides in said first and second regions being comprised of the same metal, and having a different stoichiometry, where the stoichiometry is dependent upon the dopant and doping level of said silicon regions.

14. The structure of claim 13, where said first silicon region is single crystal and said second silicon region is polycrystalline.

15. The structure of claim 13, where said first silicon region is polycrystalline and said second silicon region is single crystal.

16. The structure of claim 13, where said first and second silicon regions are coplanar.

17. The structure of claim 13, where said first and second silicon regions are non-coplanar.

18. The structure of claim 13, where said dopant and said metal can form a compound having a melting point greater than the melting point of the metal silicide phase formed with undoped silicon at the temperature of said thermal formation.

19. The structure of claim 18, where said dopant is selected in accordance with said metal from the group consisting B, Sb, P, and As.

20. A metal silicide-silicon structure, including:
a first doped silicon substrate region and a second undoped silicon substrate region,
a layer of metal silicide formed by thermal conversion of a metal deposited on said first and second silicon substrate regions, said metal silicide being formed on both said doped and undoped silicon regions, said metal silicide being substantially comprised of a single metal constituent,
wherein the dopant in said doped silicon region and its concentration are such that the temperature ranges of formation of at least two metal silicide compound phases are shifted during said thermal conversion, to produce a silicide compound phase on said doped silicon substrate region that is not present in the metal silicide formed on said undoped substrate region.

21. A metal silicide-silicon structure, including:
a first doped silicon substrate region including a selected dopant in an amount sufficient to affect the phase of a metal silicide thermally formed on said first region,
a second silicon substrate region doped to a level insufficient to affect the phase of a metal silicide thermally formed on said second region,
a metal silicide simultaneously thermally formed on both said first and second regions and containing the same metal, the compound phase of said metal silicide formed in said first region being different than the compound phase formed in said second region.

22. A metal silicide-silicon structure, comprising:
a first silicon substrate region including a selected dopant in an amount sufficient to influence the phase of a selected metal silicide compound thermally formed thereon,
a second silicon substrate region on which a different phase of said selected metal silicide compound is to be thermally formed, said second silicon substrate region being characterized by the absence of selected dopant in said sufficient amount,
a first compound phase of said selected metal silicide thermally formed on said first silicon substrate region, and
a second compound phase of said selected metal silicide thermally formed on said second silicon substrate region.

23. The structure of claim 21, wherein said first and second compound phases are simultaneously formed in the same steps.

* * * * *